United States Patent
Chang et al.

(10) Patent No.: US 7,106,620 B2
(45) Date of Patent: Sep. 12, 2006

(54) MEMORY CELL HAVING IMPROVED READ STABILITY

(75) Inventors: Leland Chang, New York, NY (US); Robert H. Dennard, Croton-on-Hudson, NY (US); Robert Kevin Montoye, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/069,018

(22) Filed: Feb. 28, 2005

(65) Prior Publication Data

US 2006/0146638 A1    Jul. 6, 2006

Related U.S. Application Data

(60) Provisional application No. 60/640,587, filed on Dec. 30, 2004.

(51) Int. Cl.
G11C 11/00 (2006.01)

(52) U.S. Cl. ............. 365/154; 365/189.01; 365/230.05

(58) Field of Classification Search ................ 365/154, 365/156, 189.01, 189.04, 230.05
See application file for complete search history.

(56) References Cited

U.S. PATENT DOCUMENTS

| | | | | |
|---|---|---|---|---|
| 5,239,501 A | * | 8/1993 | Matsui et al. ............... | 365/154 |
| 5,847,990 A | * | 12/1998 | Irrinki et al. ............... | 365/154 |
| 6,807,081 B1 | * | 10/2004 | Nii .............................. | 365/145 |
| 6,845,059 B1 | * | 1/2005 | Wordeman et al. .... | 365/230.05 |
| 6,903,962 B1 | * | 6/2005 | Nii .............................. | 365/156 |
| 2004/0156228 A1 | | 8/2004 | Becker | |

* cited by examiner

Primary Examiner—Gene N. Auduong
(74) Attorney, Agent, or Firm—Wan Yee Cheung; Ryan, Mason & Lewis, LLP

(57) ABSTRACT

A memory cell for use in a memory array includes a storage element for storing a logical state of the memory cell, a write circuit and a read circuit. The write circuit is operative to selectively connect a first node of the storage element to at least a first write bit line in the memory array in response to a write signal for selectively writing the logical state of the memory cell. The read circuit includes a substantially high impedance input node connected to the storage element and an output node connectable to a read bit line of the memory array. The read circuit is configured to generate an output signal at the output node which is representative of the logical state of the storage element in response to a read signal applied to the read circuit. The memory cell is configured such that the write circuit is disabled during a read operation of the memory cell so as to substantially isolate the storage element from the first write bit line during the read operation. A strength of at least one transistor device in the storage element is separately optimized relative to a strength of at least one transistor device in the write circuit and/or the read circuit.

21 Claims, 9 Drawing Sheets

MEMORY CELL HAVING IMPROVED READ STABILITY

CROSS-REFERENCE TO RELATED APPLICATION

This application claims the benefit of priority to U.S. Provisional Application No. 60/640,587 filed on Dec. 30, 2004, the disclosure of which is incorporated by reference herein.

FIELD OF THE INVENTION

The present invention relates generally to memory devices, and more particularly relates to a static memory cell architecture having improved stability during a read operation.

BACKGROUND OF THE INVENTION

As integrated circuit technologies are scaled, stability in a static memory cell becomes a major concern affecting the design of reliable memory arrays, including, for example, static random access memory (SRAM) arrays. Most static memory cells employ a conventional six-transistor (6-T) architecture, as depicted in FIG. 1. While this memory cell arrangement offers a compact structure, the 6-T memory cell has many disadvantages, particularly its potential inability to scale with overall technology advancements due, at least in part, to stability problems which are often exacerbated as integrated circuit process dimensions shrink.

Stability problems generally arise whenever stored voltages on internal nodes of the memory cell are disturbed. In the case of the standard 6-T memory cell illustrated in FIG. 1, this typically occurs when an access transistor (e.g., 104) connected to an internal node (e.g., node N2) with a stored logical "0" is activated with a logical "1" on a corresponding bit line (e.g., 114). When this occurs, the internal node (e.g., node N2) is pulled above ground potential, which could unintentionally flip a logical state of the memory cell. This scenario can occur as a result of a read operation of the memory cell.

As process technologies scale, process-induced variations, as well as fundamental variation sources (e.g., dopant fluctuation effect on threshold voltage, etc.), may result in large threshold voltage variations across a given wafer. This threshold voltage scatter effect essentially magnifies the disturb voltage in 6-T memory cells, which can lead to stability failures in the SRAM array in which the 6-T memory cells are employed. The scaling of power supply voltages further degrades stability by reducing noise margins in the memory cell. Existing solutions attempting to address the stability problem typically involve subtle modifications to the 6-T memory cell itself (e.g., modifying transistor sizing, threshold voltage design, increasing cell size, etc.), or to the memory array (e.g., increasing the supply voltage, etc.), to increase the stability margin. These techniques, however, generally involve a significant tradeoff between memory cell stability and performance, and may not be sufficient for future process technologies.

There exists a need, therefore, for a static memory cell architecture having improved read stability, which does not suffer from one or more of the above-noted deficiencies associated with conventional memory cell architectures.

SUMMARY OF THE INVENTION

In accordance with the aforementioned need, the present invention, in an illustrative embodiment, is an improved memory cell architecture that virtually eliminates disturbs of the memory cell during a read operation by altering a read mechanism of the memory cell. The improved memory cell is configured such that a storage element comprised in the cell is essentially electrically isolated from a corresponding word line or bit line during the read operation. The memory cell architecture of the invention is well-suited for use in an SRAM array.

In accordance with one aspect of the invention, a memory cell for use in a memory array includes a storage element for storing a logical state of the memory cell, a write circuit and a read circuit. The write circuit is operative to selectively connect a first node of the storage element to a first write bit line in the memory array in response to a write signal for selectively writing the logical state of the memory cell. The read circuit includes a substantially high impedance input node connected to the storage element and an output node connectable to a read bit line of the memory array. The read circuit is configured to generate an output signal at the output node which is representative of the logical state of the storage element in response to a read signal applied to the read circuit. The memory cell is configured such that the write circuit is disabled during a read operation of the memory cell, so as to substantially isolate the storage element from the first and second write bit lines during the read operation. A strength of at least one transistor device in the storage element is separately optimized relative to a strength of at least one transistor device in the write circuit and/or the read circuit.

In accordance with another aspect of the invention, an integrated circuit includes one or more memory cells, at least a given one of the memory cells including a storage element for storing a logical state of the memory cell, a write circuit and a read circuit. The write circuit is configurable for selectively connecting a first node of the storage element to a first write bit line in the memory array and for selectively connecting a second node of the storage element to a second write bit line in the memory array in response to a write signal for selectively writing the logical state of the memory cell. The read circuit includes a substantially high impedance input node connected to the storage element and an output node connectable to a read bit line of the memory array. The read circuit is configured to generate an output signal at the output node which is representative of the logical state of the storage element in response to a read signal applied to the read circuit. The memory cell is configured such that the write circuit is disabled during a read operation of the memory cell, so as to substantially isolate the storage element from the first and second write bit lines during the read operation. A strength of at least one transistor device in the storage element is separately optimized relative to a strength of at least one transistor device in the write circuit and/or the read circuit.

These and other objects, features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative static memory cell suitable for use, for example, in an SRAM array. It should be appreciated, however, that the invention is not limited to this or any particular memory cell architecture. Rather, the invention is more generally applicable to techniques for advantageously eliminating disturbs in a memory cell, thereby improving a stability of the memory cell, during a read operation. The memory cell of the present invention may be easily fabricated using standard integrated circuit (IC) process technology, such as, for example, a complementary metal-oxide-semiconductor (CMOS) fabrication process. Consequently, the cost of manufacturing the memory cell is not significantly increased compared to standard static memory cells.

Figure 1:
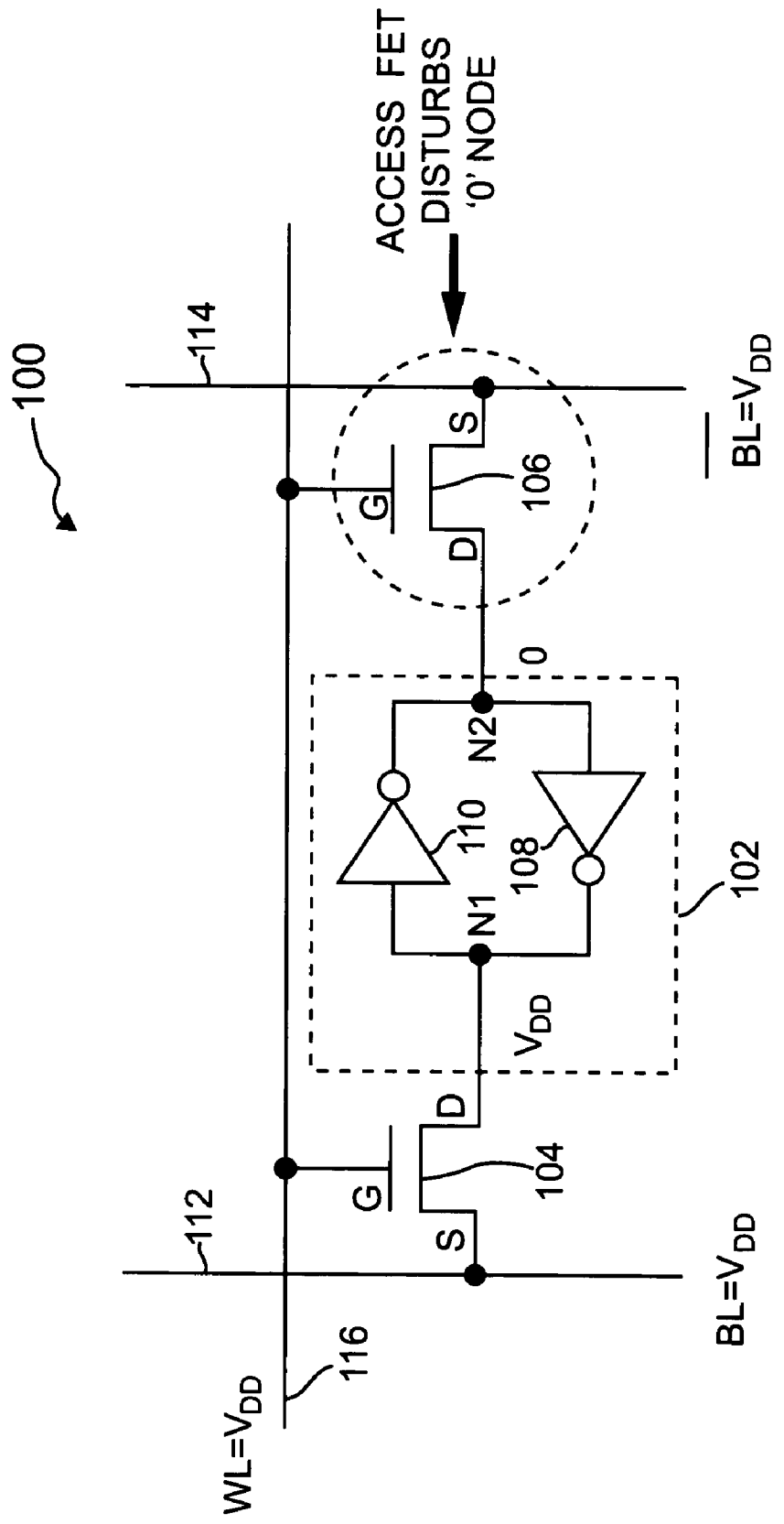
FIG. 1 is a schematic diagram illustrating a conventional six-transistor static memory cell which is used in standard SRAM arrays.

FIG. 1 is a schematic diagram illustrating a standard 6-T memory cell 100. The memory cell 100 includes a static storage element 102 that is selectively connectable to bit lines (BL) 112 and 114 via a pair of access transistors 104 and 106, respectively, each access transistor having a drain terminal (D), a source terminal (S) and a gate terminal (G). Specifically, the drain terminal of transistor 104 is connected to a first internal node N1 of the storage element 102, and the source terminal of transistor 104 is connected to bit line 112. Likewise, the drain terminal of transistor 106 is connected to a second internal node N2 of the storage element 102, and the source terminal of transistor 106 is connected to bit line 114. The access transistors 104, 106 are controlled by way of a word line signal conveyed via a corresponding word line (WL) 116 which is connected to the gate terminals of transistors 104 and 106. Access transistors 104, 106 are typically N-channel metal-oxide-semiconductor (NMOS) devices. Static storage element 102 typically comprises first and second inverters 108 and 110, respectively, connected such that an output of the first inverter 108 is connected to an input of the second inverter 110 at node N1, and an output of the second inverter 110 is connected to an input of the first inverter 108 at node N2. Each inverter typically includes a P-type metal-oxide-semiconductor (PMOS) device and an NMOS device connected in a conventional inverter arrangement.

It is to be appreciated that, because a metal-oxide semiconductor (MOS) device is symmetrical in nature, and thus bidirectional, the assignment of source and drain designations in the MOS device is essentially arbitrary. Therefore, the source and drain terminals may be referred to herein generally as first and second source/drain terminals, respectively, where the term "source/drain" in this context denotes a source terminal or a drain terminal.

During a read operation of the memory cell 100, access transistors 104, 106 are enabled by an active word line signal (e.g., VDD) on word line 116, and both bit lines 112, 114 are at a logical "1" (e.g., VDD). Turning on transistors 104 and 106 creates a substantially low-resistance (e.g., about tens of ohms) electrical path through the transistors between the internal nodes N1 and N2 of the storage element 102 and the bit lines 112 and 114, respectively. As previously stated, stability problems often occur whenever stored voltages on the internal nodes N1 and N2 of the storage element 102 are disturbed. In standard 6-T memory cells, this may arise, for example, when a given access transistor (e.g., 106) connected to an internal node (e.g., node N2) having a stored logical "0" (e.g., ground) associated therewith is activated with a logical "1" being present on the corresponding bit line (e.g., bit line 114). In this instance, the internal node is pulled above ground potential through the corresponding access transistor, which could unintentionally flip the logical state stored in the memory cell.

Figure 2:
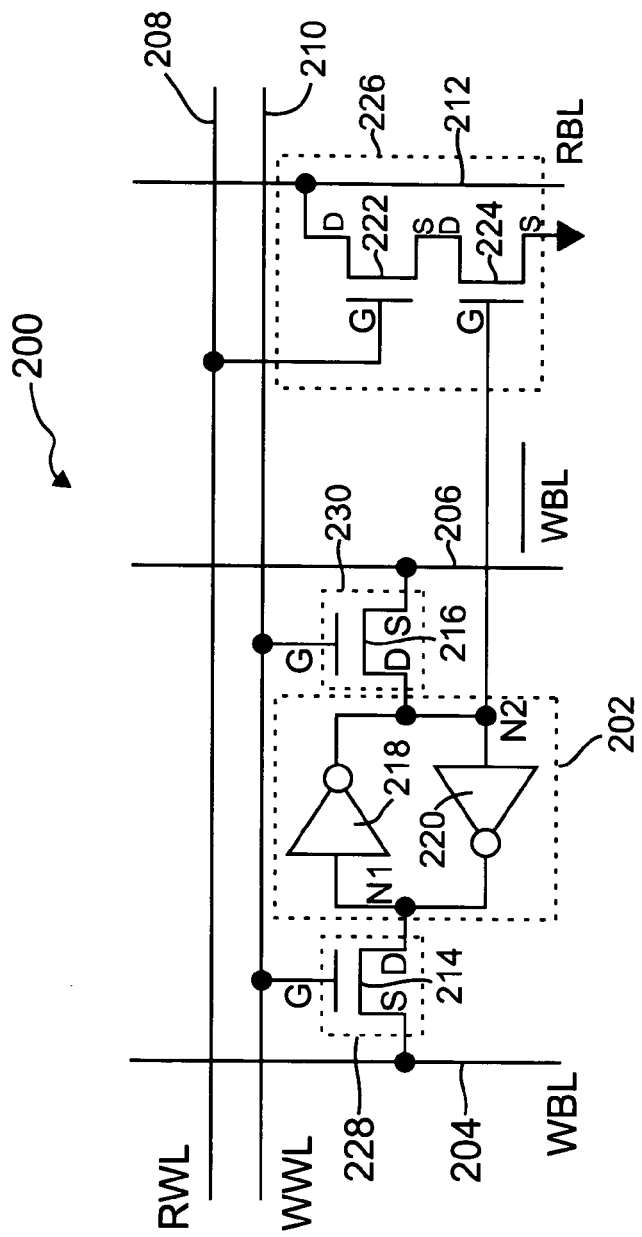
FIG. 2 is a schematic diagram illustrating an exemplary eight-transistor static memory cell which is suitable for use in an SRAM array, in accordance with one embodiment of the present invention.

FIG. 2 is a schematic diagram illustrating an exemplary eight-transistor (8-T) memory cell 200 which advantageously eliminates disturbs in the memory cell during a read operation, in accordance with one embodiment of the present invention. The exemplary 8-T memory cell 200 is particularly well-suited for use in an SRAM array, although the memory cell is not limited to such an application. Furthermore, the techniques of the invention described herein are not limited to the specific memory cell circuit arrangement shown.

The exemplary 8-T memory cell 200 comprises a static storage element 202 which is selectively connectable to first and second write bit lines (WBL) 204 and 206 via first and second write access circuits 228 and 230, respectively. In a preferred embodiment of the invention, write access circuits 228 and 230 comprise NMOS access transistors 214 and 216, respectively, although alternative connection circuitry is similarly contemplated. Specifically, a source terminal of transistor 214 is connected to write bit line 204, and a drain terminal of transistor 214 is connected to a first internal node N1 of the storage element 202. Likewise, a source terminal of transistor 216 is connected to write bit line 206, and a drain terminal of transistor 216 is connected to a second internal node N2 of the storage element 202. Gate terminals of access transistors 214 and 216 are connected to a corresponding write word line (WWL) 210 for conveying a write signal. The access transistors 214, 216 function to selectively connect the storage element 202 to the write bit lines 204, 206 in response to the write signal. The first and second write access circuits 228, 230 may be implemented as a single write circuit. It is to be understood that, in accordance with an alternative embodiment of the invention, the memory cell 200 may be used in a single-ended manner, in which case a single write bit line (e.g., 206) and corresponding access transistor (e.g., 216) may be employed.

The static storage element 202 preferably comprises first and second inverters 218 and 220, respectively, configured such that an output of the first inverter 218 is connected to an input of the second inverter 220 at node N2, and an output of the second inverter 220 is connected to an input of the first inverter 218 at node N1. Each inverter 218, 220 may include a PMOS device and an NMOS device (not shown) connected in a conventional inverter arrangement. While the four-transistor storage element arrangement depicted in FIG. 2 provides a substantially compact circuit structure, alternative circuit configurations for implementing the static storage element 202 are similarly contemplated, as will be understood by those skilled in the art.

The circuit arrangement, including first and second access transistors 214, 216 and the static storage element 202 may appear similar to the 6-T memory cell configuration shown in FIG. 1, except that write bit lines 204 and 206 in memory cell 200 are substituted for the bit lines 112 and 114, respectively, in memory cell 100, and write word line 210 in memory cell 200 is substituted for the word line 116 in memory cell 100. It is to be appreciated that, during a write operation of memory cell 200, the basic operation of the memory cell is essentially the same compared to writing a standard 6-T memory cell. Specifically, the access transistors 214, 216 are enabled by an active write signal on the write word line 210, and the write bit lines 204, 206 may be used to write the logical state of the memory cell as in a conventional manner. Accordingly, the techniques of the present invention are directed primarily to the read operation of the memory cell 200, as will be described in further detail herein below.

In order to eliminate disturbs of the memory cell 200 during the read operation, the memory cell is preferably configured so as to electrically isolate the static storage element 202 from any of the bit lines or word lines in the memory array, in which the memory cell 200 may be employed. To accomplish this, the exemplary memory cell 200 includes a separate read circuit 226 connected to a corresponding read bit line (RBL) 212 and read word line (RWL) 208 for selectively activating the read circuit. It is to be appreciated that, in accordance with an alternative embodiment of the invention, the read bit line 212 may be connected together with a write bit line (e.g., 206). Although possibly impacting the speed of the memory cell to some extent, this arrangement could beneficially reduce the number of bit lines required in the memory array. The read circuit 226 preferably comprises first and second NMOS transistors 222 and 224, respectively, connected in a stacked arrangement. Specifically, a drain terminal of first transistor 222 is connected to the read bit line 212, a source terminal of the first transistor is connected to a drain terminal of the second transistor 224, and a source terminal of transistor 224 is connected to ground, or an alternative reference source. A gate terminal of transistor 222 is connected to the read word line 208 and forms a first input of the read circuit 226, and a gate terminal of transistor 224 is connected to internal node N2 of the storage element 202 and forms a second input of the read circuit.

In accordance with an illustrative embodiment of the invention, the read circuit 226 is configured such that a substantially low resistance (e.g., about tens of ohms) electrical path is formed between the drain terminal of the first transistor 222 and the source terminal of the second transistor 224 when both the first and second inputs of the read circuit are enabled (e.g., VDD). It is to be understood that alternative read circuitry may be similarly employed in the memory cell 200, as may become apparent to those skilled in the art.

When reading memory cell 200, an active read signal (e.g., VDD) is applied to the corresponding read word line 208, thereby turning on transistor 222 in the read circuit 226. When a logical "1" is stored at node N2, transistor 224 in the read circuit 226 is turned on, thereby creating an electrical path and allowing current to flow, when the corresponding read bit line 212 is raised above ground potential, between the read bit line and ground through transistors 222 and 224. Likewise, when a logical "0" is stored at node N2, transistor 224 is turned off and thus the electrical path between read bit line 212 and ground is effectively broken, thereby preventing current from flowing between the read bit line and ground. A sense amplifier, or alternative sensing circuitry, connected to the read bit line 212 is preferably operative to detect a voltage and/or current difference on the read bit line and to equate this difference with the logical state of the memory cell 200.

During the read operation, access transistors 214 and 216, which are enabled during the write operation, are disabled, such as, for example, by applying a logical "0" to the corresponding write word line 210. Disabling transistors 214 and 216 during the read operation serves to electrically isolate the static storage element 202 from the corresponding write bit lines 204 and 206. Moreover, since the gate terminal of transistor 224, which is connected to node N2 of the storage element 202, has a substantially high impedance associated therewith (e.g., greater than one megohm), the internal node N2 is essentially electrically isolated from the read bit line 212 during both the read and write operations. When configured in accordance with the present invention, the exemplary memory cell 200 provides a mechanism for reading the memory cell which is beneficially decoupled from the mechanism used to write the memory cell. This memory cell arrangement also allows for dual-port operation, wherein simultaneous read and write operations can be performed in different cells of the memory array.

As previously stated, during the read operation, a sense amplifier is generally connected to a bit line corresponding to the memory cell(s) being read. In the case of the standard 6-T memory cell 100 depicted in FIG. 1, which utilizes both bit lines 112, 114, a differential (e.g., double-ended) sense amplifier is required. Differential sense amplifiers, which rely heavily on symmetry, are highly sensitive to IC process variations, such as, for example, threshold voltage mismatch, and therefore must be carefully designed so as to minimize the effects of such variations. Consequently, differential sense amplifiers generally require a more complex and robust circuit architecture. In contrast, the exemplary 8-T memory cell 200 shown in FIG. 2 is capable of utilizing a single read bit line 212 during the read operation, and therefore may be used in conjunction with a single-ended sense amplifier. Single-ended sense amplifiers are favored since they are typically less complex in circuit topology and are more tolerant of IC process variations compared to differential sense amplifiers.

There are at least two interrelated issues affecting the stability of a memory cell, namely, read stability and noise margins. Intuitively, read stability relates to how likely it is to invert (e.g., disturb) the memory cell's stored value when accessing the cell during a read operation. Static noise margin (SNM) of a memory cell, on the other hand, may be defined as the minimum direct current (DC) noise voltage necessary to flip the logical state of the memory cell, particularly during a standby mode of operation of the memory cell. The primary issue affecting the overall stability of the memory cell is read stability. Static noise margin may be more easily visualized by creating a butterfly curve corresponding to a given memory cell. Butterfly curves can be generated by plotting transfer characteristics of the memory cell over variations in process, voltage and/or temperature (PVT) conditions associated with the memory cell. By way of example, a Monte Carlo analysis can be performed to obtain a distribution for the static noise margin of the memory cell.

Figure 3A:
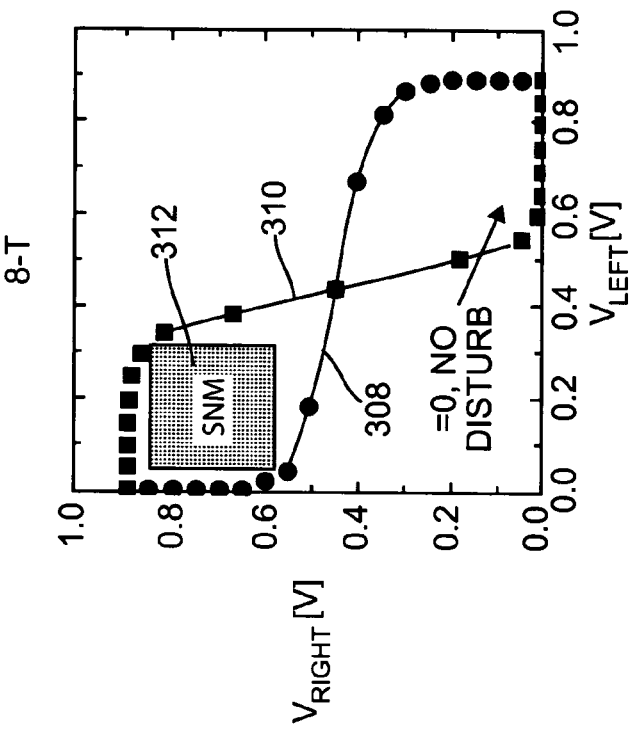
FIG. 3A is a graphical representation depicting static noise margin in the conventional static memory cell shown in FIG. 1.
Figure 3B:
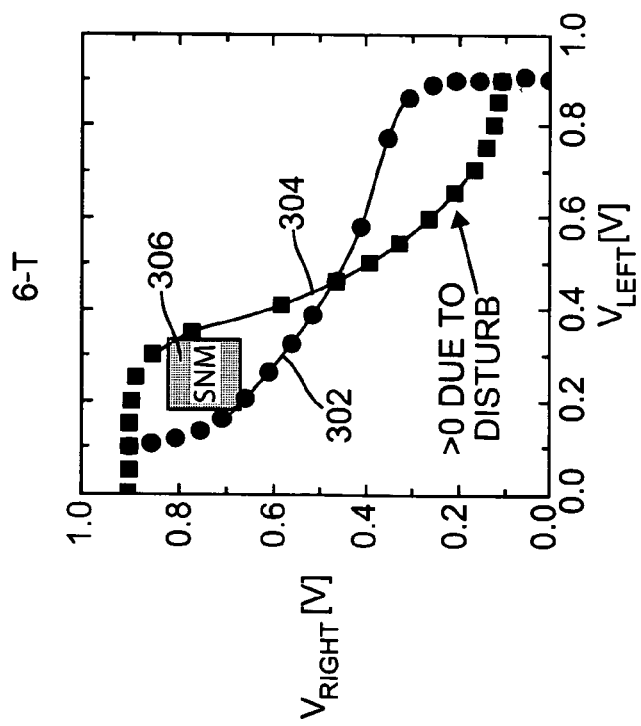
FIG. 3B is an exemplary graphical representation depicting static noise margin in the static memory cell shown in FIG. 2.

FIGS. 3A and 3B are exemplary graphical representations depicting static noise margin for the 6-T memory cell 100 shown in FIG. 1 and for the 8-T memory cell 200 shown in FIG. 2, respectively. As shown in FIG. 3A, the exemplary butterfly curve for the 6-T memory cell 100 may be comprised of two curves 302, 304 representing the transfer characteristics of the two inverters 108, 110 (see FIG. 1) overlaid on top of one another under worst case stability conditions. Likewise, as shown in FIG. 3B, the exemplary butterfly curve for the 8-T memory cell 200 may be comprised of two curves 308, 310 representing the transfer characteristics of the two inverters 218, 220 (see FIG. 2) overlaid on top of one another under worst case stability conditions. In general, for a given butterfly curve, the larger the area bounded by the two curves (e.g., 302, 304), which may also be referred to as "eyes" of the butterfly curve, the more stable the memory cell. Static noise margin may be defined as a side of the largest square that can be drawn within the "eyes."

As apparent from FIGS. 3A and 3B, the exemplary 8-T memory cell of the present invention achieves a static noise margin that is more than twice the static noise margin of the standard 6-T memory cell design. This improvement in static noise margin may be attributed to the fact that in the 8-T memory cell, the access transistors 214 and 216 are turned off during the read operation, thereby eliminating disturbs. The 8-T memory cell configuration is able to tolerate a significantly larger threshold voltage scatter, and can therefore be advantageously scaled to more aggressive IC process technologies in which an increased threshold voltage variation and/or lower supply voltage (e.g., VDD) can be expected.

With regard to layout of the 6-T memory cell in comparison to the exemplary 8-T memory cell 200, the 8-T memory cell generally consumes more area in the IC (e.g., about thirty percent more) due, at least in part, to the additional read circuit 226 and corresponding read bit line 212 and read word line 208 included in the memory cell, as shown in FIG. 2. Of course, the tradeoff in increased IC area is outweighed by the substantial increase in read stability provided by the 8-T memory cell architecture. Furthermore, depending on the specific application in which the memory cell is to be employed, the conventional 6-T memory cell design may simply not be suitable for use without significant modifications thereto. These modifications generally increase the size and/or complexity of the 6-T memory cell.

Figure 4:
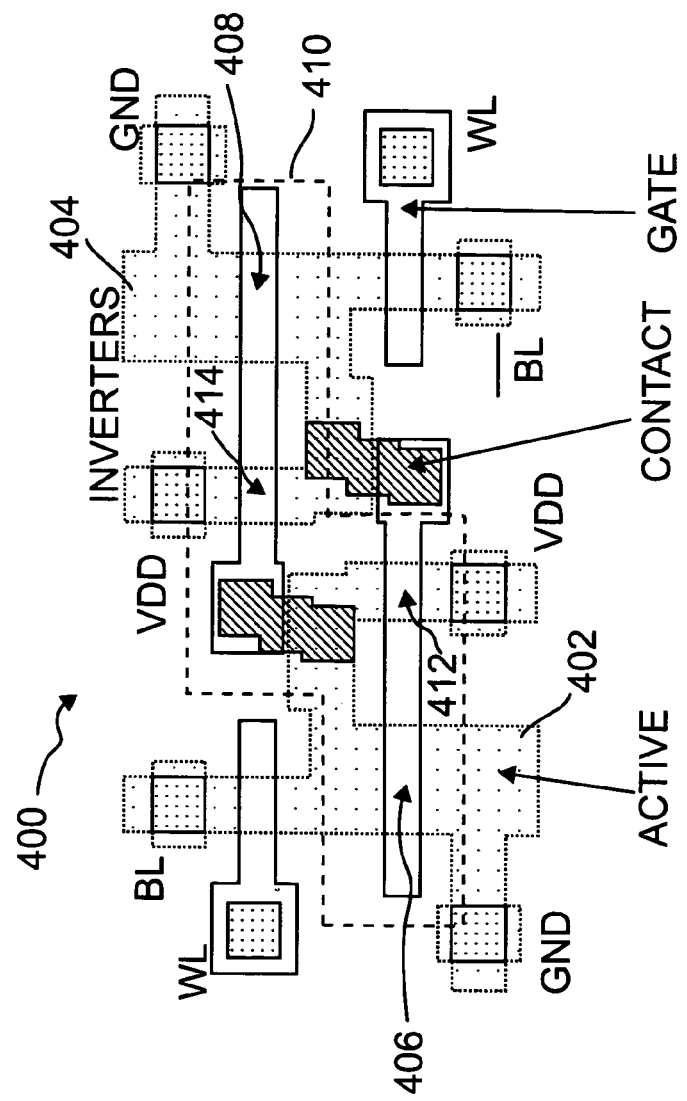
FIG. 4 is a top plan view depicting an illustrative integrated circuit layout for the conventional static memory cell shown in FIG. 1.

FIG. 4 is a top plan view illustrating an exemplary IC layout 400 of the standard 6-T memory cell 100 shown in FIG. 1. Active areas 402 and 404 are generally drawn as arbitrary shapes. As apparent from the figure, the NMOS devices 406 and 408 comprised in inverters 410 forming the static storage element are sized about twice as large as corresponding PMOS devices 412 and 414 to help insure stability in the memory cell. By way of comparison only, and without loss of generality, FIG. 5 is a top plan view illustrating at least a portion of an exemplary layout 500 of the 8-T memory cell 200 shown in FIG. 2.

Figure 5:
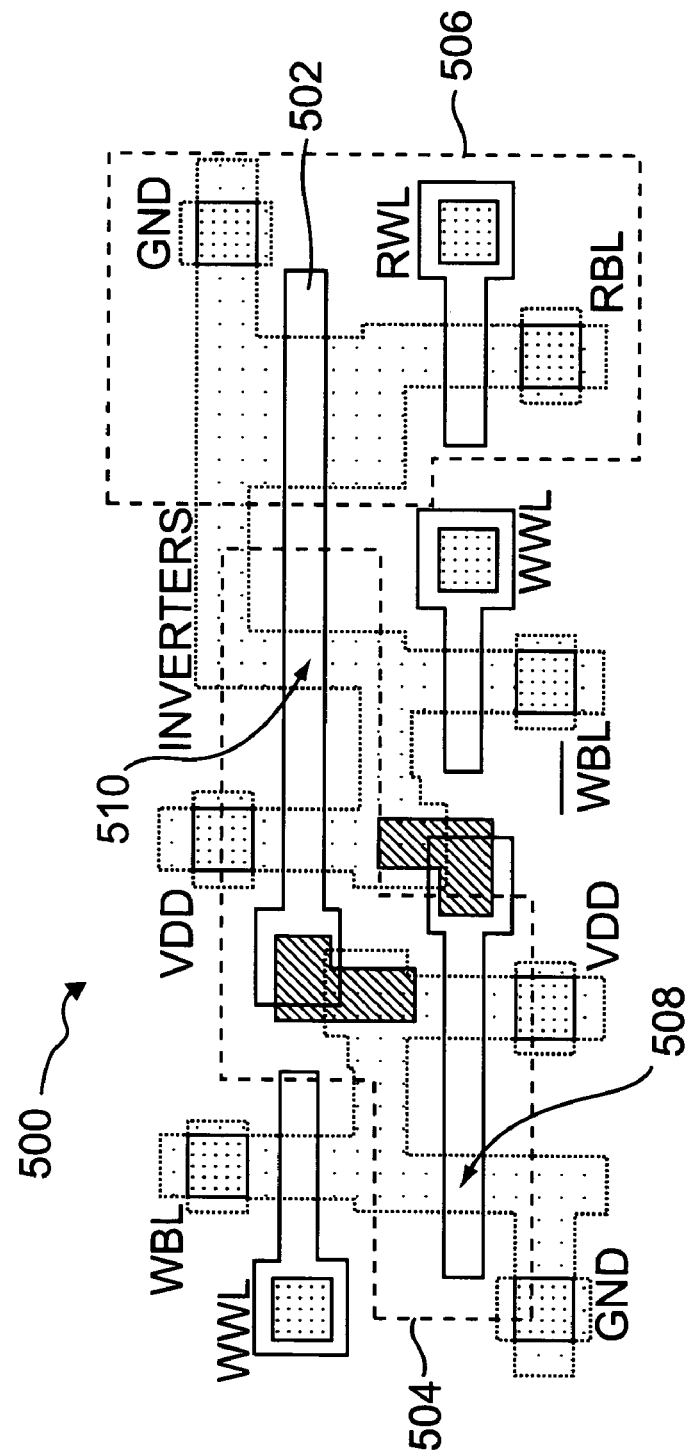
FIG. 5 is a top plan view depicting an exemplary integrated circuit layout for the static memory cell shown in FIG. 2, in accordance with an embodiment of the invention.

As shown in FIG. 5, the 8-T memory cell can be formed in an area-efficient manner, such as, for example, by lengthening gate electrode 502 of one of the two inverters 504 forming the static storage element in the standard 6-T memory cell layout and then adding read circuit 506, which may be comprised of two stacked NMOS transistors (see FIG. 2), without adding extra contacts. The 8-T memory cell layout 500 can preferably be mirrored in a rolling fashion (e.g., up, down, left and right) to share all contacts across adjacent neighboring cells. Moreover, as apparent from the figure, in the exemplary 8-T memory cell layout 500, the sizes of the NMOS devices 508, 510 in the inverters 504 can be reduced to minimum dimensions, like their corresponding PMOS devices, because the beta ratio of the cell (e.g., the ratio of the NMOS pull-down device to the pass-gate access transistor) is no longer required to be greater than about two to ensure the stability of the memory cell.

Figure 6:
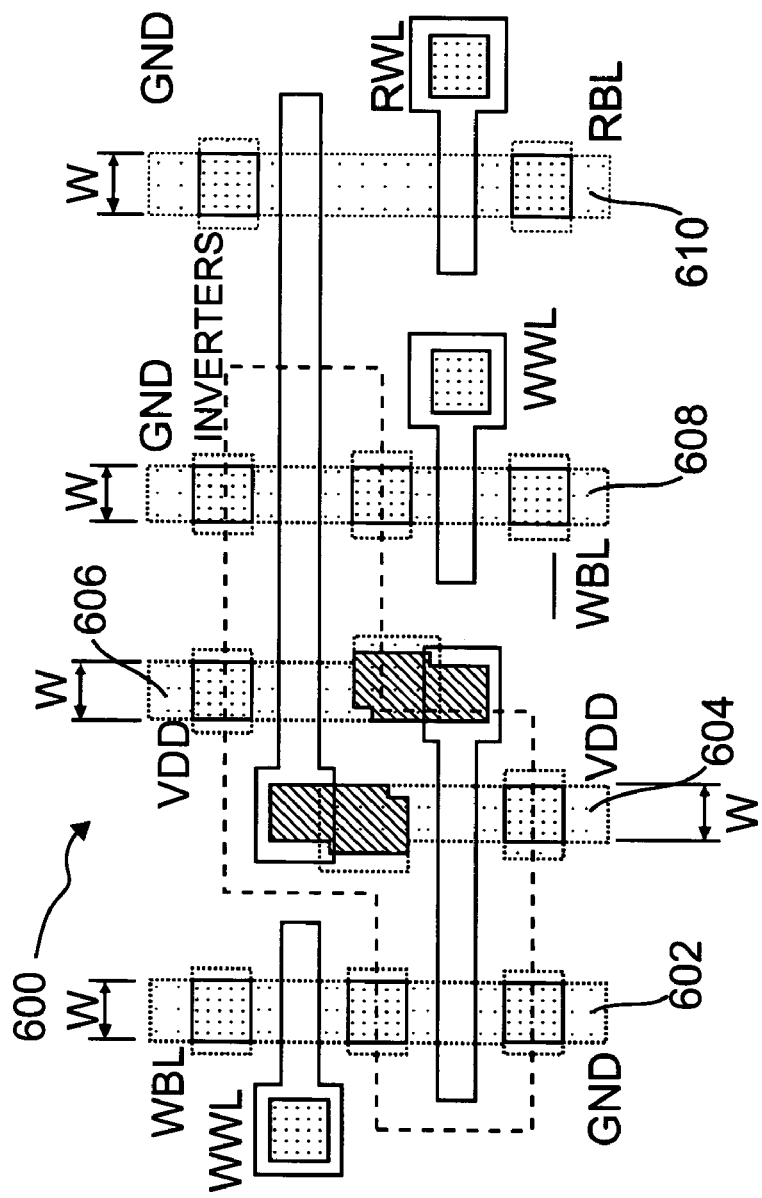
FIG. 6 is a top plan view depicting an exemplary integrated circuit layout for the static memory cell shown in FIG. 2, in accordance with another embodiment of the invention.

FIG. 6 is a top plan view depicting an exemplary layout 600 of the 8-T memory cell 200 shown in FIG. 2, in accordance with another embodiment of the invention. As apparent from the figure, the exemplary memory cell layout 600 comprises a plurality of active regions 602, 604, 606, 608 and 610, preferably formed on a substantially regular grating, with each active region preferably having substantially the same width W relative to one another. Moreover, a spacing between any two adjacent active regions 602, 604, 606, 608 and 610 is preferably substantially the same. This layout technique, which may be referred to as a "straight RX" cell design, in addition to providing increased scalability of the memory cell, thereby improving a packing density thereof, facilitates the lithography process and improves device yield, thus reducing the overall cost of manufacturing the memory cell.

With reference again to FIG. 2, since, in the exemplary memory cell configuration of the present invention, the read and write mechanisms are isolated from one another, the circuitry employed for reading the memory cell 200, namely, read circuit 226, and the circuitry employed for writing the memory cell, namely, write access circuits 228, 230, can be independently optimized relative to the storage element 202 and relative to one another. In accordance with an aspect of the invention, a strength of one or more transistor devices comprised in the storage element 202 is preferably modified relative to a strength of one or more transistor devices in the read circuit 226 and/or write access circuits 228, 230. The strength of a given transistor device can be affected by many characteristics of the device, including, but not limited to, the device threshold voltage, oxide thickness, and/or channel width-to-length (W/L) ratio of the device, as will be apparent to those skilled in the art.

Figure 7:
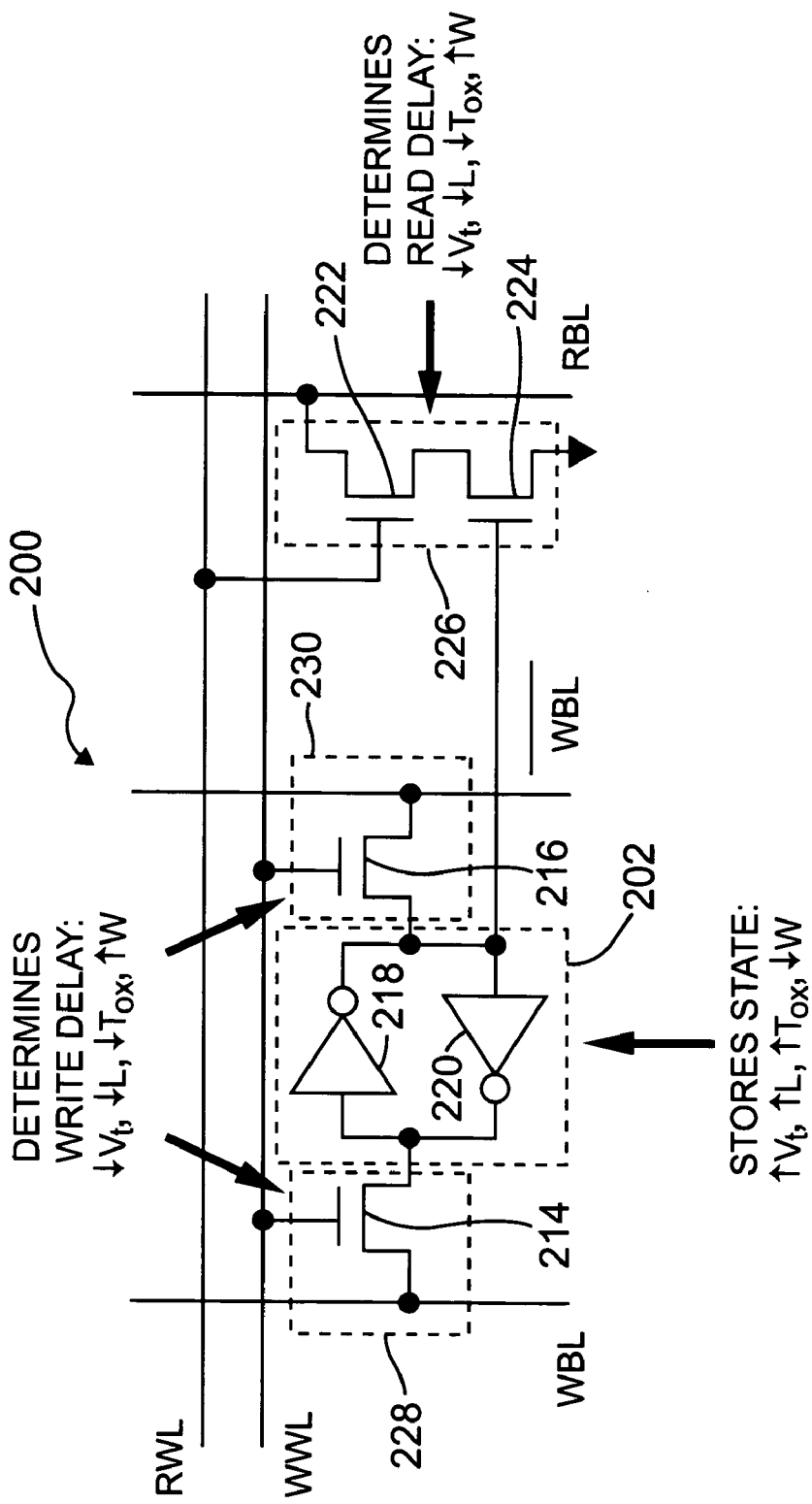
FIG. 7 is a schematic diagram of the exemplary eight-transistor static memory cell shown in FIG. 2 wherein certain portions of the memory cell are selectively optimized for improving performance and/or stability, in accordance with another aspect of the present invention.

FIG. 7 is a schematic diagram illustrating the exemplary 8-T memory cell 200 depicted in FIG. 2, including certain optimizations which can be made to further enhance the stability of the memory cell. As previously stated, the read and write mechanisms in exemplary memory cell 200 are essentially isolated from one another. Specifically, during a write operation, access transistors 214 and 216 in write access circuits 228 and 230, respectively, are enabled, and access transistors 222 and 224 in read circuit 226 are disabled. Likewise, during a read operation, transistors 222 and 224 are enabled and transistors 214, 216 are disabled. Ideally, it is desirable to make the write access transistors

214, 216 and read transistors 222, 224 as strong as possible and the transistors in storage element 202 as weak as possible. Unfortunately, however, in a 6-T memory cell arrangement, there is a tradeoff between stability and performance.

As will be understood by those skilled in the art, the speed of a given MOS device is generally a function of the strength of the device, and thus the stronger the device, the faster the device. Device strength is typically controlled as a function of one or more IC process characteristics, including, but not limited to, threshold voltage ($V_t$) and oxide thickness ($T_{ox}$), and one or more dimensional characteristics, such as, for example, channel length (L) and channel width (W) of the device. Typically, the strength (and thus the speed) of a device can be increased by decreasing the threshold voltage, by decreasing the channel length, by decreasing the oxide thickness, and/or by increasing the channel width. Typically, a channel W/L ratio is specified for a given transistor device. By increasing the W/L ratio of the device, the strength of the device can be increased accordingly. Likewise, the strength (and thus the speed) of a device can be decreased by increasing the threshold voltage, by increasing the channel length, by increasing the oxide thickness, and/or by decreasing the channel width. Low-threshold voltage devices generally modify the shape of the butterfly curve associated with the memory cell by reducing the size of the eyes. Thus, using low-threshold devices typically results in a smaller SNM for the memory cell. Accordingly, in order to reduce the effect of disturbs during the read operation in the standard 6-T memory cell, all devices are typically high threshold voltage devices, which significantly increases a read and write delay of the memory cell.

As shown in FIG. 7, the exemplary 8-T memory cell 200 is preferably configured such that the write access transistors 214, 216 and the read transistors 222, 224 are made as strong as possible, limited essentially by leakage characteristics and/or layout area. Each of these devices may be strengthened, for example, by decreasing one or more of the threshold voltage, channel length and oxide thickness, and/or by decreasing the channel width of the device, as previously explained. Strengthening these devices does not impact memory cell stability, since disturbs during the read operation are substantially eliminated in the exemplary 8-T memory cell arrangement 200.

With regard to the static storage element 202 in the memory cell 200, the inverters 218, 220 can be optimized by making the transistor devices therein as weak (and thus as slow) as possible. Since the devices in storage element 202 are only used to store the logical state of the memory cell 200, making these devices slow will have virtually no impact on read delay (since the logical state of the cell is not being changed), and only negligible impact on write delay. Furthermore, weaker devices generally provide reduced leakage and increased noise margin compared to stronger devices, thereby reducing power consumption and improving the stability of the memory cell. Using devices having a high threshold voltage, thick oxide, longer channel length, and/or shorter channel width will reduce subthreshold and gate leakage, thereby reducing standby power consumption in the memory cell relative to conventional memory cell designs. Additionally, larger channel length devices can beneficially reduce the impact of line width variations, thereby reducing threshold voltage scatter commonly exhibited in standard memory cell architectures.

It is to be appreciated that while the memory cell architecture of the present invention can be employed to eliminate disturbs during the read operation of the memory cell, as previously explained, disturbs which may occur during the write operation of the memory cell are not addressed herein. This issue can instead be addressed in a higher architectural level of a memory array in which the memory cell may be implemented, for example, by elimination of column select circuitry typically included in the memory array.

Figure 8:
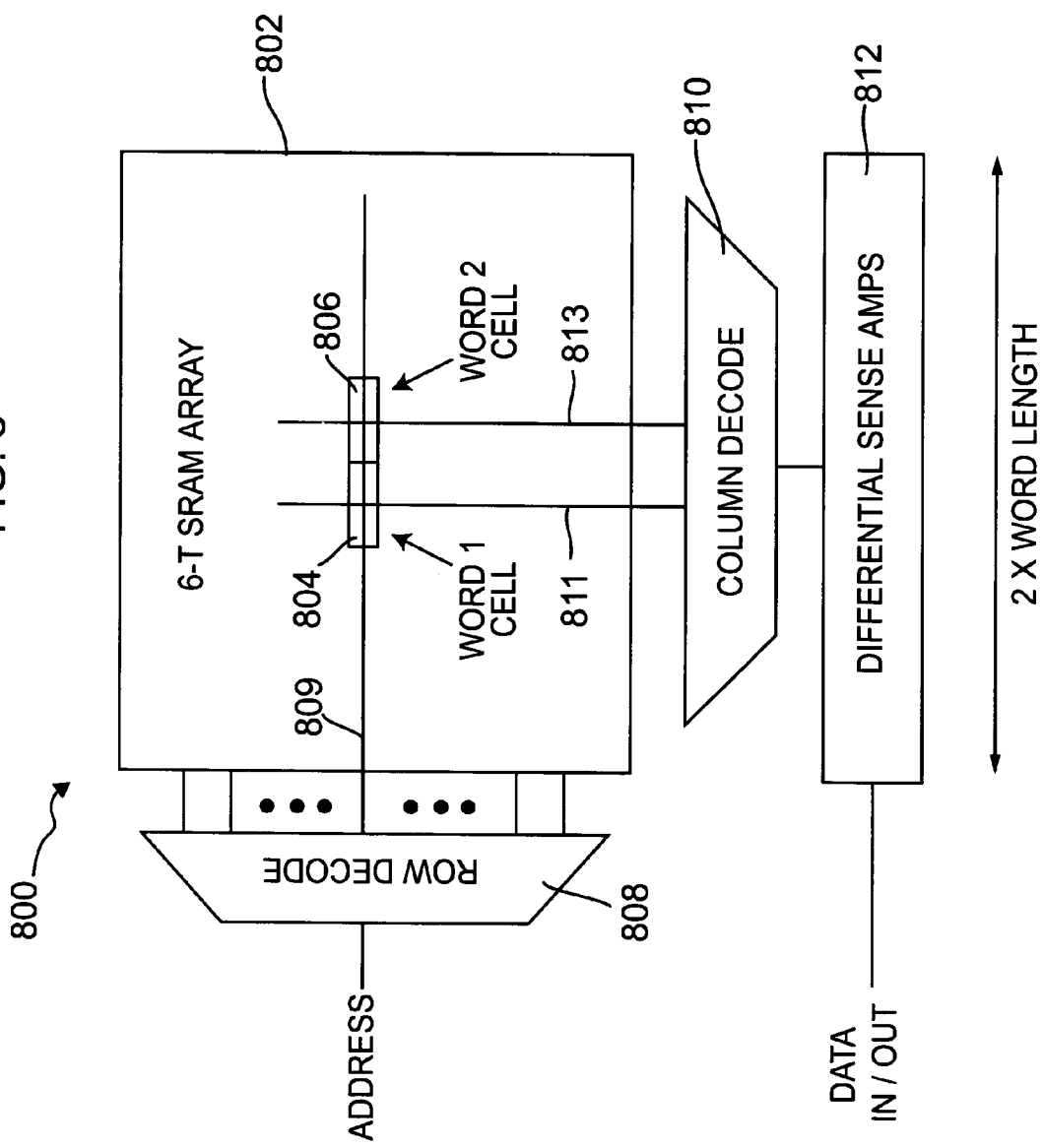
FIG. 8 is a block diagram depicting a traditional 6-T SRAM array with two-way column selection.

FIG. 8 is a block diagram depicting a traditional 6-T SRAM array 800 with 2-way column select. The array 800 comprises a plurality of memory cells 802, including memory cells 804 and 806, row decode circuitry 808 connected to the memory cells via at least one corresponding word line 809, column decode circuitry 810 connected to the memory cells via a plurality of bit lines 811, 813, and a plurality of differential sense amplifiers 812. Such an array organization shares the word line 809 across memory cells 804, 806 that comprise two separate words and relies on the column decode circuitry 812 to select one of the two words. During a write operation, memory cells in the word that is not selected experience a write disturb, in which the word line is asserted and the complementary bit lines (in the column select operation) are both held high. This creates an identical situation to the read disturb, which can lead to SRAM cell instability.

In accordance with the techniques of the present invention, read disturbs are eliminated in a given memory cell by the addition of separate read circuitry, as previously explained. Write disturbs are preferably addressed in a higher architectural level of a memory array in which the given memory cell may be implemented. Column select capability, which is a primary source of write disturbs, are advantageously eliminated, as will be described below.

Figure 9:
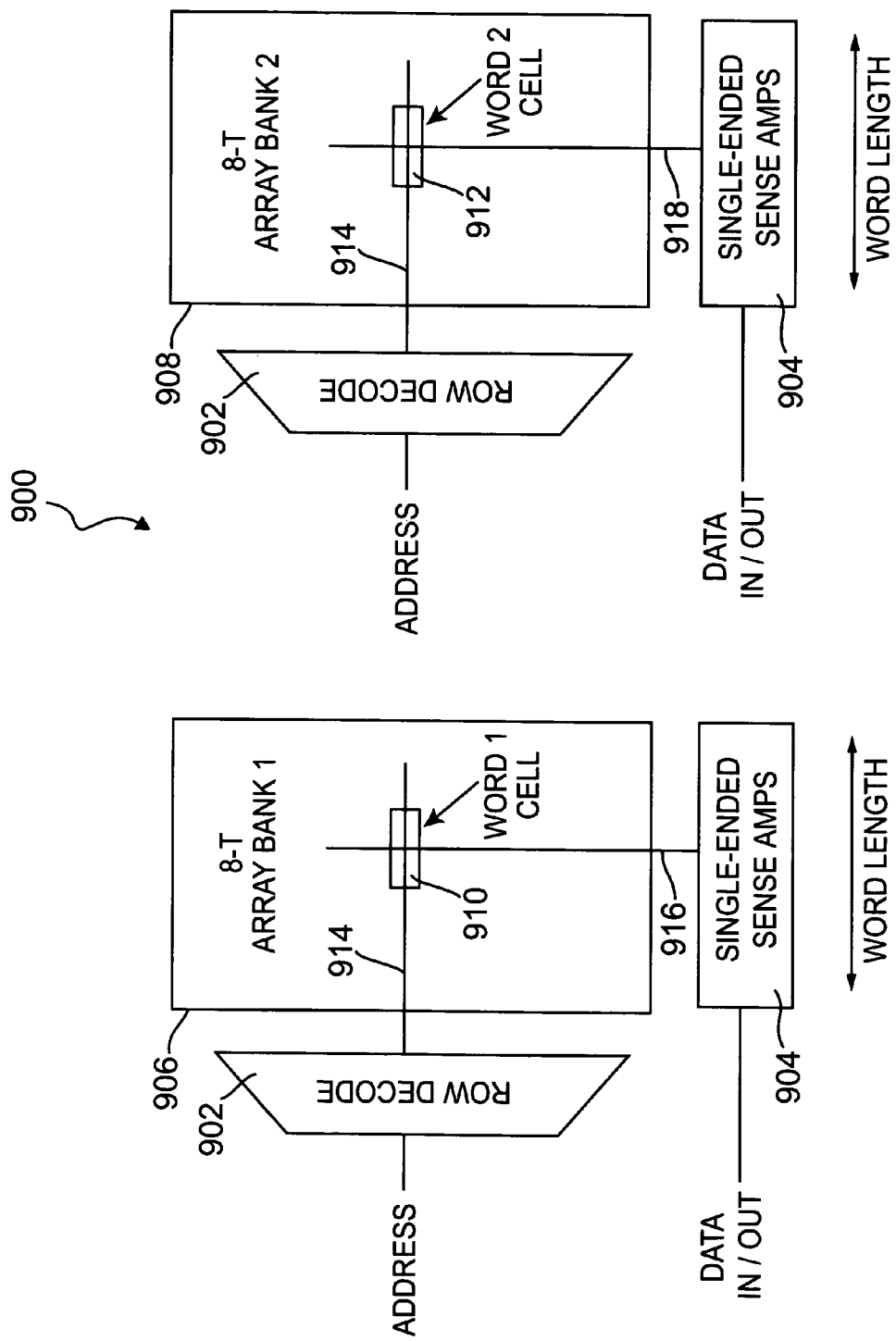
FIG. 9 is a block diagram depicting an exemplary memory array in which the techniques of the invention are implemented.

FIG. 9 is a block diagram depicting an exemplary memory array 900 in which the techniques of the invention are implemented. The exemplary memory array 900 comprises row decode circuitry 902 connected to a plurality of corresponding memory cells, including memory cells 910 and 912, via at least one word line 914, and a plurality of single-ended sense amplifiers 904 connected to corresponding memory cells via a plurality of bit lines 916, 918. Memory cells 910 and 912 may be implemented in accordance with the memory cell configuration shown in FIG. 2. Using this memory cell configuration, the need for separate column decode circuitry is essentially eliminated, since word lines will not be shared across memory cells that are in different words. As apparent from the figure, by eliminating column decode circuitry in the memory array 900, the word line length is shortened to become the length of a given word itself.

When a write word line corresponding to a given memory cell is enabled, all memory cells connected to that write word line must also be written at the same time in the same spatial location. Instead of using column selection in a single memory bank to choose between different words 910, 912 in the memory array, words along the same word line 914 can simply be stored in different memory banks 906 and 908. Organizing the memory array in separate banks of memory cells eliminates any possibility of a write disturb, which, combined with the elimination of read disturbs at the memory cell level, significantly improves memory cell stability under substantially all operating conditions. Alternative modifications of the row decode circuitry 902 are similarly contemplated, as will become apparent to those skilled in the art. For example, additional bits can be added to an error correction coding (ECC) scheme used by the memory array 900. Alternatively, an external column decode or a bit-select option could be used within each memory cell itself in order to achieve column select functionality.

At least a portion of the memory cell and/or SRAM array of the present invention may be implemented in an integrated circuit. In forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A memory cell for use in a memory array, the memory cell comprising:
    a storage element for storing a logical state of the memory cell;
    a write circuit operative to selectively connect a first node of the storage element to at least a first write bit line in the memory array in response to a write signal for selectively writing the logical state of the memory cell; and
    a read circuit including a substantially high impedance input node connected to the storage element and an output node connectable to a read bit line of the memory array, the read circuit being configured to generate an output signal at the output node which is representative of the logical state of the storage element in response to a read signal applied to the read circuit;
    wherein: (i) the write circuit is disabled during a read operation of the memory cell so as to substantially isolate the storage element from the at least first write bit line during the read operation; and (ii) a strength of at least one transistor device in the storage element is separately optimized relative to a strength of at least one transistor device in at least one of the write circuit and the read circuit.

2. The memory cell of claim 1, wherein the read circuit comprises first and second transistors, a first source/drain terminal of the first transistor being connectable to the read bit line, a second source/drain terminal of the first transistor being connected to a first source/drain terminal of the second transistor, a second source/drain terminal of the second transistor being connected to a reference source, a gate terminal of the first transistor receiving the read signal, and a gate terminal of the second transistor being connected to the storage element.

3. The memory cell of claim 2, wherein the first and second transistors comprise N-channel metal-oxide-semiconductor devices.

4. The memory cell of claim 1, wherein the write circuit comprises a first transistor, a first source/drain terminal of the first transistor being connected to the first node of the storage element, a second source/drain terminal of the first transistor being connectable to the first write bit line, and a gate terminal of the first transistor receiving the write signal.

5. The memory cell of claim 4, wherein the first transistor comprises an N-channel metal-oxide semiconductor device.

6. The memory cell of claim 1, wherein the storage element comprises first and second inverters, an output of the first inverter being connected to an input of the second inverter, and an input of the first inverter being connected to an output of the second inverter.

7. The memory cell of claim 1, wherein the memory cell is configured such that a strength of transistor devices comprised in the read and write circuits is greater relative to a strength of transistor devices comprised in the storage element.

8. The memory cell of claim 1, wherein one or more process parameters of the memory cell are selectively controlled so as to increase a speed of the read and write circuits relative to a speed of the storage element.

9. The memory cell of claim 1, wherein the storage element comprises at least one transistor device having a first threshold voltage associated therewith, and at least one of the read and write circuits comprises at least one transistor device having a second threshold voltage associated therewith, the first threshold voltage being greater than the second threshold voltage.

10. The memory cell of claim 1, wherein the storage element comprises at least one transistor device formed having a first oxide thickness associated therewith, and at least one of the read and write circuits comprises at least one transistor device formed having a second oxide thickness associated therewith, the first oxide thickness being greater than the second oxide thickness.

11. The memory cell of claim 1, wherein the storage element comprises at least one transistor device having a first channel width-to-length ratio associated therewith, and at least one of the read and write circuits comprises at least one transistor device having a second width-to-length ratio associated therewith, the second width-to-length ratio being greater than the first width-to-length ratio.

12. The memory cell of claim 1, wherein the memory cell comprises a plurality of transistor devices, the transistor devices being formed in a plurality of active regions forming a substantially regular grating, wherein a width of each active region is substantially the same relative to one another, and a spacing between any two adjacent active regions is substantially the same.

13. The memory cell of claim 12, wherein all gate electrodes corresponding to one or more transistor devices in the storage element, the read circuit and the write circuit are oriented in substantially the same direction.

14. The memory cell of claim 1, wherein the write circuit is further operative to selectively connect a second node of the storage element to a second write bit line in the memory array in response to the write signal for selectively writing the logical state of the memory cell, the second node being a logical complement of the first node.

15. The memory cell of claim 14, wherein the write circuit further comprises a second transistor, a first source/drain terminal of the second transistor being connected to the second node of the storage element, a second source/drain terminal of the second transistor being connectable to the second write bit line, and a gate terminal of the second transistor receiving the write signal.

16. The memory cell of claim 1, wherein at least one transistor device in the read circuit comprises a gate formed as an extension of a gate electrode of at least one transistor device in the storage element.

17. A memory array, comprising:
a plurality of memory cells;
a plurality of write bit lines and write word lines connected to the memory cells for selectively writing a logical state of at least one of the memory cells corresponding thereto; and
a plurality of read bit lines and read word lines connected to the memory cells for selectively reading the logical state of at least one of the memory cells corresponding thereto;
wherein at least a given one of the memory cells comprises:
  a storage element for storing a logical state of the memory cell;
  a write circuit configurable for selectively connecting a first node of the storage element to a given one of the write bit lines in response to a write signal for selectively writing the logical state of the memory cell; and
  a read circuit including a substantially high impedance input node connected to the storage element and an output node connectable to a given one of the read bit lines, the read circuit being configured to generate an output signal at the output node which is representative of the logical state of the storage element in response to a read signal applied to a given one of the read word lines connected to the memory cell;
  wherein: (i) the write circuit is disabled during a read operation of the memory cell so as to substantially isolate the storage element from the at least first write bit line during the read operation; and (ii) a strength of at least one transistor device in the storage element is separately optimized relative to a strength of at least one transistor device in at least one of the write circuit and the read circuit.

18. The memory array of claim 17, further comprising row decode circuitry operatively connected to the plurality of memory cells via the plurality of read and write word lines, the row decode circuitry being configured such that when at least a given one of the write word lines corresponding to at least a given one of the memory cells is enabled, all memory cells connected to the given write word line are written at substantially the same time in the same spatial location.

19. The memory array of claim 18, further comprising a plurality of single-ended sense amplifiers connected to the plurality of memory cells via the plurality of read and write bit lines, each of the sense amplifiers being operative to selectively read the logical state of at least one of the memory cells corresponding thereto, at least one of the row decode circuitry and the sense amplifiers being configured so as to eliminate a need for column decode circuitry.

20. The memory array of claim 17, wherein the plurality of memory cells is arranged into a plurality of memory banks, wherein each memory cell corresponding to a same write word line resides in a different memory bank.

21. An integrated circuit including at least one memory cell, the at least one memory cell comprising:
  a storage element for storing a logical state of the memory cell;
  a write circuit operative to selectively connect a first node of the storage element to at least a first write bit line in the memory array in response to a write signal for selectively writing the logical state of the memory cell; and
  a read circuit including a substantially high impedance input node connected to the storage element and an output node connectable to a read bit line of the memory array, the read circuit being configured to generate an output signal at the output node which is representative of the logical state of the storage element in response to a read signal applied to the read circuit;
  wherein: (i) the write circuit is disabled during a read operation of the memory cell so as to substantially isolate the storage element from the at least first write bit line during the read operation; and (ii) a strength of at least one transistor device in the storage element is separately optimized relative to a strength of at least one transistor device in at least one of the write circuit and the read circuit.

* * * * *